(12) United States Patent
Kurtz et al.

(10) Patent No.: US 6,326,682 B1
(45) Date of Patent: Dec. 4, 2001

(54) HERMETICALLY SEALED TRANSDUCER AND METHODS FOR PRODUCING THE SAME

(75) Inventors: Anthony D. Kurtz, Teaneck; Alexander Ned, Bloomingdale, both of NJ (US)

(73) Assignee: Kulite Semiconductor Products, Leonia, NJ (US)

( * ) Notice: Subject to any disclaimer, the term of this patent is extended or adjusted under 35 U.S.C. 154(b) by 0 days.

(21) Appl. No.: 09/217,877

(22) Filed: Dec. 21, 1998

(51) Int. Cl.$^7$ .................................................. H01L 23/02
(52) U.S. Cl. ........................ 257/678; 257/415; 257/417; 257/419
(58) Field of Search .................................... 257/678, 415, 257/417, 419

(56) References Cited

U.S. PATENT DOCUMENTS

| | | | |
|---|---|---|---|
| 3,764,950 | * 10/1973 | Wallia | 257/419 |
| 4,815,845 | * 3/1989 | Kurtz | 257/419 |
| 5,614,742 | * 3/1997 | Gessner et al. | 257/417 |
| 5,656,846 | * 8/1997 | Yamada | 257/415 |

* cited by examiner

Primary Examiner—Roy Potter
(74) Attorney, Agent, or Firm—Arthur L. Plevy; Duane, Morris & Heckscher

(57) ABSTRACT

A reduced size, hermetically sealed semiconductor transducer and methods for fabricating the same. In a preferred embodiment, the transducer comprises a transducer wafer including a diaphragm which deflects upon the application of a force thereto. At least one semiconductor transducer element and one electrical contact are disposed on a top surface of the transducer wafer, with the electrical contact coupled to the semiconductor element and extending to a peripheral portion of the wafer. A cover member is provided that is dimensioned to surround the semiconductor element. A peripheral glass frit bond is formed between the cover member and the transducer wafer, and between the cover member and at least a portion of the electrical contact. An aperture is formed in a top portion of the cover member, positioned above a region bounded by the peripheral glass bond. This aperture functions to prevent air gap formation in the peripheral glass frit bond. A sealing member hermetically seals the aperture, whereby a vacuum is maintained between the transducer element and the cover member, the transducer element thereby being hermetically sealed from the external environment, while at least a portion of the electrical contact remains exposed to enable subsequent wire bonding thereto.

13 Claims, 6 Drawing Sheets

HERMETICALLY SEALED TRANSDUCER AND METHODS FOR PRODUCING THE SAME

FIELD OF THE INVENTION

The present invention relates generally to semiconductor transducers and more particularly, to a reduced size, hermetically sealed semiconductor transducer and methods for fabricating the same.

BACKGROUND OF THE INVENTION

Semiconductor piezoresistive transducers have been widely known for many years and are used in a great variety of applications and harsh environments which require the transducer to be protected from the environment. In addition, in order to provide absolute pressure measurements, the transducer sensing elements must often be contained within a cavity of a known pressure, usually a vacuum, to provide a pressure reference. This vacuum cavity must of course be hermetically sealed to maintain the vacuum and protect the sensing elements. Such transducers are termed "absolute" pressure transducers, and may be fabricated as extremely small devices for use in the medical field, as pressure sensors in automobiles, and so on. The smaller the transducer can be manufactured for the given pressure range, the wider variety of applications that are possible and the cheaper the price.

Techniques for hermetically sealing semiconductor piezoresistive transducers from hostile environments have generally limited how small the transducers could be made since additional lateral space has been required to accommodate a hermetically sealing cover structure. Essentially, the piezoresistive transducer employs silicon resistive elements, the resistance of which varies according to the intensity or magnitude of an applied force upon an associated diaphragm. Such resistors comprise serpentine or tortuous line patterns. It is these resistor elements which must be hermetically isolated from the external environment to ensure proper sensing performance.

An example of such hermetically sealed environmentally protected absolute piezoresistive transducers is disclosed in U.S. Pat. No. 5,002,901 entitled "Method of Making Integral Transducer Structures Employing High Conductivity Surface Features" issued on Mar. 26, 1991 to A. Kurtz et al. and assigned to the assignee herein. The piezoresistive elements in that patent are formed over the central region of a dielectric layer which overlays a silicon diaphragm. The elements are arranged to form a Wheatstone bridge where the four circuit nodes of the bridge are configured as four p+ silicon electrical contact posts disposed on the peripheral corners of the device. Electrical interconnections, also comprised of p+ silicon, interconnect the contact posts with the piezoresistive transducer elements. A bias voltage is brought to two of the contacts, while the voltage is measured between the other two contacts. This is accomplished by bonding external wires to each contact, which wires are run to an external voltage source and potentiometer.

As the silicon diaphragm deflects in response to an applied force or pressure, the resistive of the piezoresistive transducer elements changes, thereby changing the measured voltage. The actual applied force or pressure can then readily be determined from the measured voltage.

The hermetic seal for this device was provided by fabricating a peripheral flange on the device's outer periphery beyond the contact posts. In this way an absolute cavity can be made which will provide a vacuum reference. A glass sheet cover is then bonded to the top of the flange to create the hermetic seal. The glass sheet is also bonded to the outside of the contact posts, while openings are left atop the contact posts to enable subsequent wire bonding thereto. A major drawback of this configuration is that the peripheral flange undesirably increases the size of the overall device. Moreover, the contact posts must be enlarged to provide adequate surface area for bonding to both the glass sheet and to the external wire bonds. This likewise increases the size of the device.

Accordingly, it would be desirable to reduce the size of this type of transducer by eliminating the above described additional space allocated to the hermetically sealing structure of the semiconductor transducer, and the required enlargement of the contact posts.

It is therefore an object of the present invention to provide a reduced size, hermetically sealed semiconductor transducer with a vacuum cavity reference in which the hermetically sealing structure contributes only minimally to the overall size of the device.

It is another object of the present invention to provide an improved method for fabricating such a reduced size, hermetically sealed semiconductor transducer.

SUMMARY OF THE INVENTION

The present invention is directed towards a reduced size, hermetically sealed semiconductor transducer and methods for fabricating the same. In a preferred embodiment, the transducer comprises a transducer wafer including a diaphragm with a dielectric layer disposed thereon, which diaphragm deflects upon the application of a force thereto. At least one piezoresistive element and two electrical contacts are disposed on a top surface of the dielectric layer, with the electrical contacts coupled to the piezoresistive element and extending to a peripheral portion of the dielectric layer. A cover member is provided that is dimensioned to surround the semiconductor element. The cover member is provided with corner apertures which will be congruent with the contact posts when the cover member is aligned with the transducer wafer. A peripheral glass frit bond is formed between the cover member and the transducer wafer. A central aperture is formed in a top portion of the cover member, positioned above a region bounded by the peripheral glass bond. This central aperture functions to allow the glass frit bond to be formed at atmospheric pressure which prevents air gap formation in the peripheral glass frit bond. A sealing member is used which covers the central aperture, where the sealing member may be bonded to the cover member in a vacuum environment to hermetically seal the aperture. This results in a vacuum being maintained between the transducer element and the cover and sealing members, the transducer element thereby being hermetically sealed from the external environment (with a vacuum reference) while at least a portion of the electrical contact remains exposed to enable subsequent wire bonding thereto.

The present invention is also directed towards a method for fabricating a hermetically sealed transducer of the type having a transducer wafer including a diaphragm and at least one semiconductor element disposed on a top surface of the transducer wafer. The method comprises the steps of: forming at least one electrical contact on the top surface of the transducer wafer, coupled to the semiconductor element and extending from the semiconductor element to an outer portion of the top surface; providing a cover member dimensioned to surround the semiconductor element and having an aperture formed therein; forming a peripheral glass frit bond between the cover member and the transducer wafer, and between the cover member and at least a portion of the electrical contact; and, hermetically sealing the aperture in a vacuum, so that a vacuum is maintained between the at least one semiconductor element and the cover member whereby the semiconductor element is hermetically sealed from the external environment while at least a portion of the electrical contact remains exposed.

BRIEF DESCRIPTION OF THE FIGURES

For a full understanding of the present invention, reference is had to an exemplary embodiment thereof, considered in conjunction with the accompanying drawings, for which.

DETAILED DESCRIPTION OF THE PREFERRED EMBODIMENT

Figure 1:
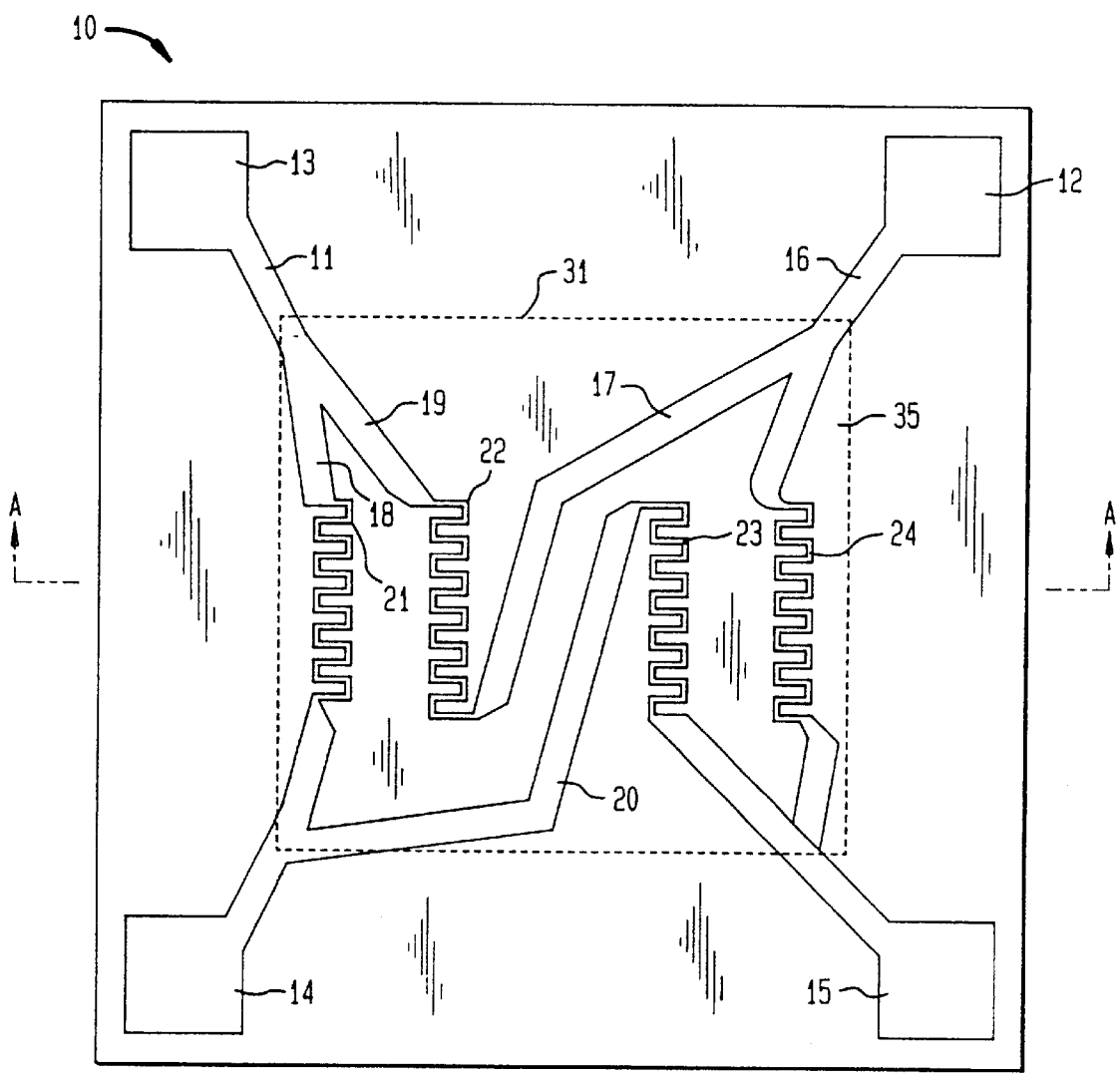
FIG. 1 is a plan view of a transducer structure according to the present invention prior to it being hermetically sealed.

Referring to FIG. 1, there is shown a plan view of a pressure transducer 10 which is to be hermetically sealed in accordance with the teachings of the present invention to be subsequently described. The pressure transducer 10 is of the type having serpentine or tortuous piezoresistors 21–24 composed of highly doped (P+) silicon. Each piezoresistor 21–24 is essentially a variable resistor in one of four legs of a Wheatstone bridge circuit with each of the respective resistances varying in proportion to an applied force or pressure to the transducer 10. The portion of the transducer 10 defined within the dotted lines 31 is generally referred to as the "active area" 35 of the transducer since this area 35 overlays a region of a diaphragm (to be described) that deflects upon the application of a force to the diaphragm. The areas of the transducer 10 that are external to the active area 35 are termed the "non-active" areas.

The four circuit nodes of the Wheatstone bridge consist of electrical contacts 12–15, and which are located in the non-active areas of the transducer. Interconnecting the contacts 12–15 with the piezoresistors 21–24 are electrical interconnections as 16–19, which are also P+ silicon. These areas are all formed simultaneously by the methods to be described. It is noted that the contacts 12–15 being doped P+ are conductive, as are the interconnections 16–19, to allow ohmic contact between the piezoresistive array and the respective contacts. (While we are using the terms "electrical contacts" and "interconnections" for convenience, it is understood that these terms can be considered together to essentially consist of integral electrical contacts that interconnect the piezoresistor elements with the outside world). The interconnections 16–19 are wider than the piezoresistors 21–24 to provided a low resistance path to the contacts 12–15, while the long, tortuous lengths and narrow widths of the piezoresistors are designed to provide a desired resistance for those elements. External leads (not shown) can be readily attached to each contact 12–15 to supply a bias voltage to two opposite nodes of the bridge (such as contacts 13 and 15) and to externally measure the voltage between the two other nodes (as contacts 12 and 14). The contacts and or the interconnections may also be coated with a metal film which lowers unwanted resistance and facilitates lead attachment. The film can be formed by vapor deposition, sputtering or any other suitable method. The attachment of the external leads can be readily accomplished conventionally by any of a number of suitable techniques such as thermocompression bonding. One can then readily determine the applied pressure from the measured voltage.

Figure 2:
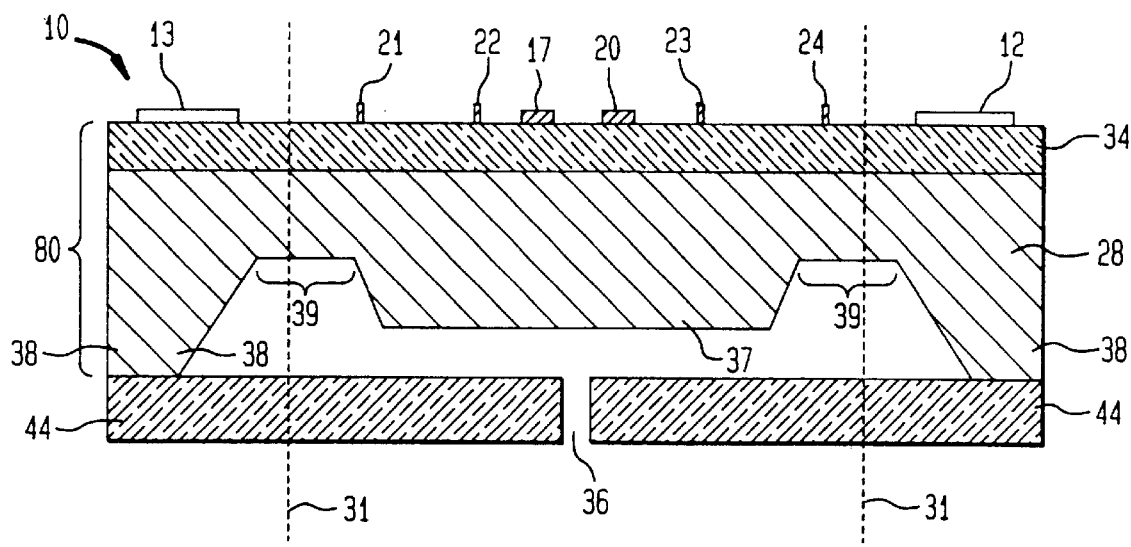
FIG. 2 shows the cross sectional view AA of FIG. 1.

Referring now to FIG. 2, which is the cross-sectional view AA of FIG. 1, it is seen that the piezoresistors 21–24, electrical contacts 12–15, and interconnections as 17 and 20 are disposed on a common dielectric layer 34, preferably silicon dioxide. The dielectric layer 34 is formed on a silicon diaphragm 28 which in cross section has a central portion denoted by the dotted lines 31 that generally define two extremes of the transducer active area. This configuration which includes the dielectric layer 34 is generally known as a dielectrically "isolated" pressure transducer. In this case, the dielectric layer 34 and the silicon diaphragm 28 together comprised a transducer wafer 80.

It is understood that the piezoresistors 12–24, electrical contacts 12–15 and interconnections as 17 and 20 could alternatively be disposed directly into the top surface of the silicon diaphragm 28. In this "non dielectrically isolated" embodiment of the transducer 10, the transducer wafer 80 would consist entirely of silicon—i.e., the dielectric isolating layer 34 would be eliminated. In any event, the hermetic sealing technique of the present invention will be described with reference to the "dielectrically isolated" transducer type defined above. However, it is understood that the non-isolated type of transducer can likewise be hermetically sealed using the method of the present invention.

The shown structure is that containing a "bossed" diaphragm. The bossed diaphragm having a thick rectangular outer frame 38 surrounding a thin rectangular region 39 which in turn surrounds another thick rectangular region 37. The outer frame 38 is electrostatically bonded to a glass wafer 44. The inner rectangle 37 is called the boss and the entire structure resembles a picture frame (in the bottom view absent the glass sheet 44) wherein under the application or force or pressure the central boss 37 deflects with respect to the outer frame 38. This deflection induces a large stress in the inner thin region 39 which stress is in turn communicated to the piezoresistive elements 21–24, thereby changing their resistances. As the diaphragm 28 deflects, air escapes through the aperture 36 of the glass layer 44.

In any event, it is understood that other suitable configurations for the diaphragm structure can be used if so desired, and the exact structure used is not critical to the novelty of the present invention to be described. In addition, the transducer 10 is shown in the FIG. 1 to have a generally square or rectangular platform; however, it is understood that other geometric configurations such as cylindrical and soon can likewise be employed.

The fabrication of the pressure transducer structure 10 depicted in FIGS. 1 and 2 can be readily accomplished using conventional processes known in the art. A preferred process is that described in U.S. Pat. No. 5,286,671 entitled "Fusion Bonding Technique For Use in Fabricating Semiconductor Devices", to A. Kurtz et al., issued February 1994, the subject matter of which is incorporated herein by reference. In that patent, it is taught to start with a n-type sacrificial wafer into which the high conductivity p+ areas which form the resistors and contact regions are diffused using oxide and/or nitride masking and photolithography. Subsequent to the diffusion, the surface of the wafer is treated with a conductivity-selective etch which does not attack the p+ areas, leaving them raised from the surface. The sacrificial wafer is then fusion-bonded to a "diaphragm" wafer which has been previously treated to obtain a 5000 Å to 15,000 Å silicon dioxide layer thereon. Subsequent to the fusion bonding, the n-type material of the sacrificial wafer is removed using a conductivity-selective etch, leaving only the p+ resistor pattern and the contact areas bonded to the diaphragm wafer. The position of the resistors with respect to the diaphragm is, of course, determined by the form factor of the diaphragm, i.e., flat plate or bossed structure. The diaphragm wafer itself may be shaped using known etching techniques as is taught in U.S. Pat. No. 4,236,137 entitled "Semiconductor Transducer Employing Flexure Frames" to Kurtz et al., November, 1980, and assigned to the assignee herein, which patent is incorporated herein by reference. The resulting structure is now called a transducer wafer, which is essentially the transducer wafer 80 in FIG. 2 herein (including the resistor patterns and electrical contacts thereon). At this point, one may electrostatically bond the glass wafer 44 to the non-sensing side of the transducer wafer 80 for additional stiffening, as is shown in FIG. 2. The glass wafer 44 may be made of pyrex or silicon containing a pyrex layer.

Using the above-described process, a plurality of transducers 10 may be manufactured simultaneously for low cost volume production. This is accomplished by electrostatically bonding a large silicon wafer containing a plurality of diaphragm structures 28 to a large glass wafer containing a plurality of central apertures 36. Each of the central apertures 36 correspond to one of the active areas 35 of an associated diaphragm 28.

Figure 3A:
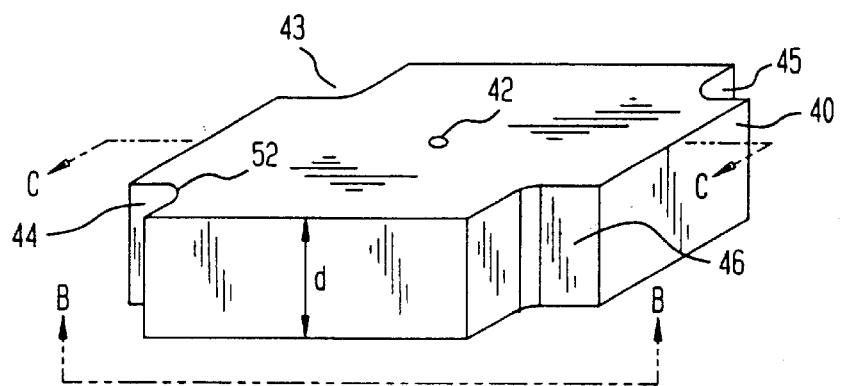
FIG. 3A is a perspective view of a single cover member according to the present invention.

Turning now to FIG. 3A, there is shown a perspective view of a cover wafer or "cover" 40, preferably silicon, which is to be bonded to the sensing surface of the transducer wafer structure 10 of FIGS. 1–2. It is understood that geometries other than square may be utilized for the cover member 40 with the geometry used being generally congruent to that of the transducer structure 10. In any event, the cover member 40 has a thickness "d" which is on the order of 3–20 mils thick. A series of generally square longitudinal cut-outs 43–46 are made in the cover wafer 40, with each cut-out to be aligned with one group of the electrical contacts typically 12–15 of the transducer wafer 80. As will be explained below, the purpose of the cut-outs 43–46 are to leave the electrical contacts 12–15 exposed when the cover 40 is integrated with the transducer 10, thereby affording external electrical lead connection to the contacts. A series of apertures 42 are created in the central portion of the cover wafer 40, which apertures extends through to opposite sides of the cover wafer 40. (The exact location of the apertures 42 with respect to the sensors is not critical—however, it must be within the area enclosed by the peripheral glass layer 62 of FIG. 6B to be described below).

Figure 3B:
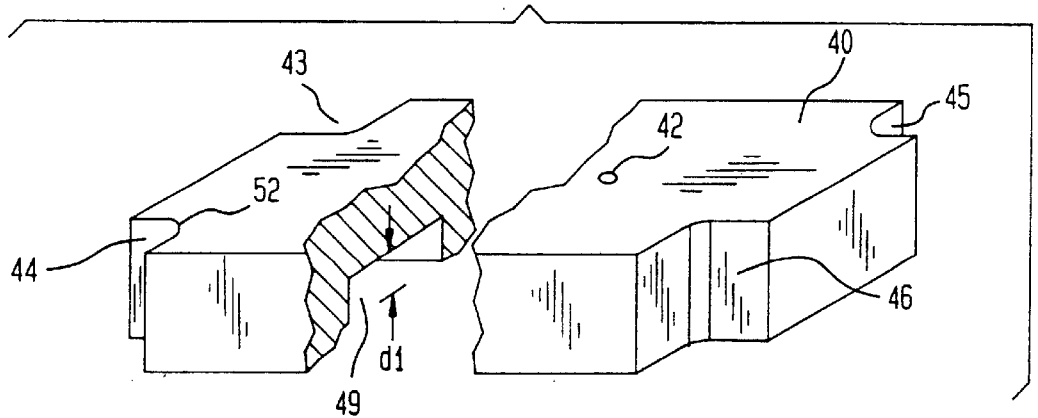
FIG. 3B shows a broken perspective view of the cover member of FIG. 3A.

As is apparent from the broken perspective view of FIG. 3B, the cover wafer 40 has a series of central cut-out 49 which extends a distance d1 from the bottom surface of the wafer. As will be explained below, each cut-out 49 will prevent the silicon cover wafer 40 from directly contacting the piezoresistors 21–24 when the assembly is completed. By proper choice of dimensions the cover wafer can also function as an over pressure stop. The depth d1 of the cut-out 49 should correspond to the full scale deflection of the diaphragm 28.

Figure 4:
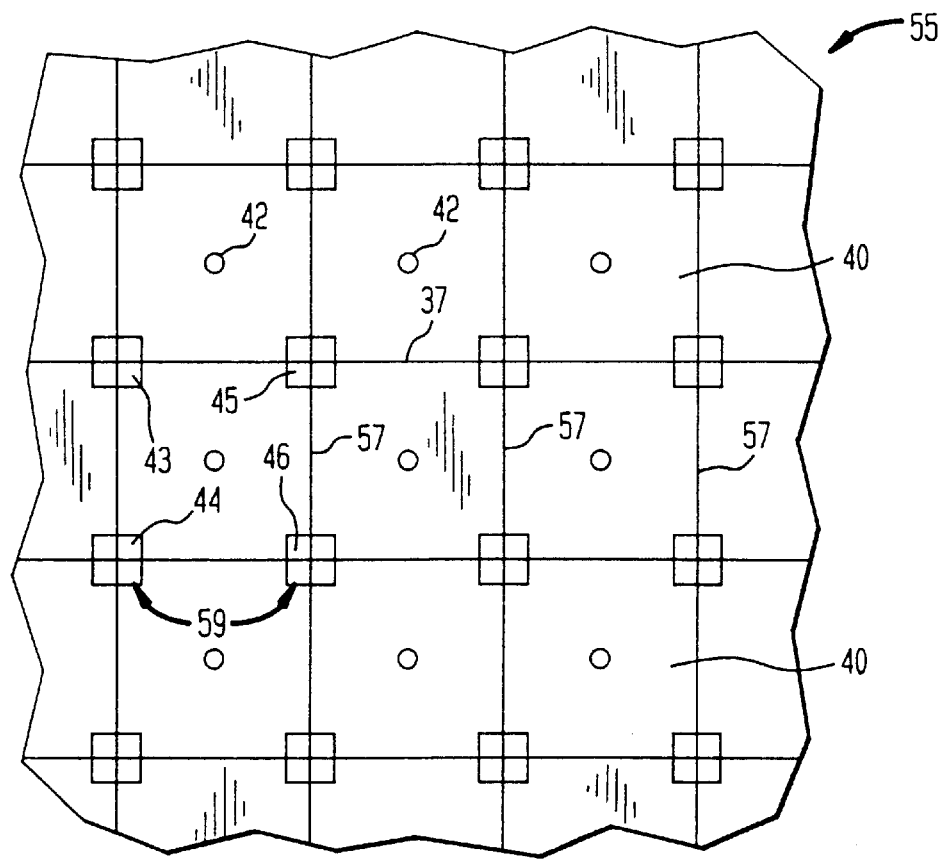
FIG. 4 depicts a large silicon cover wafer from which a plurality of cover members with corner cut-outs are to be diced.

With reference now to FIG. 4, there is shown a silicon cover wafer 55 from which individual cover members 40 are fabricated after sealing. Advantageously, the cut-outs 43–46 and apertures 49 are first machined in the cover wafer 55 prior to the cover members 40 being sealed to the transducer wafer. The shown dicing lines 57 demarcate the individual covers 40 to be diced. The corner cut-outs 43–46 are created on four different dice at once by machining square cut-outs as 59 prior to the dicing using automatic numerically controlled machining or the like. The apertures 42 are likewise drilled prior to dicing, and the central cut-outs 49 (not shown) on the opposite sides of the several cover wafers 40 can also be automatically machined prior to dicing.

Figure 5:
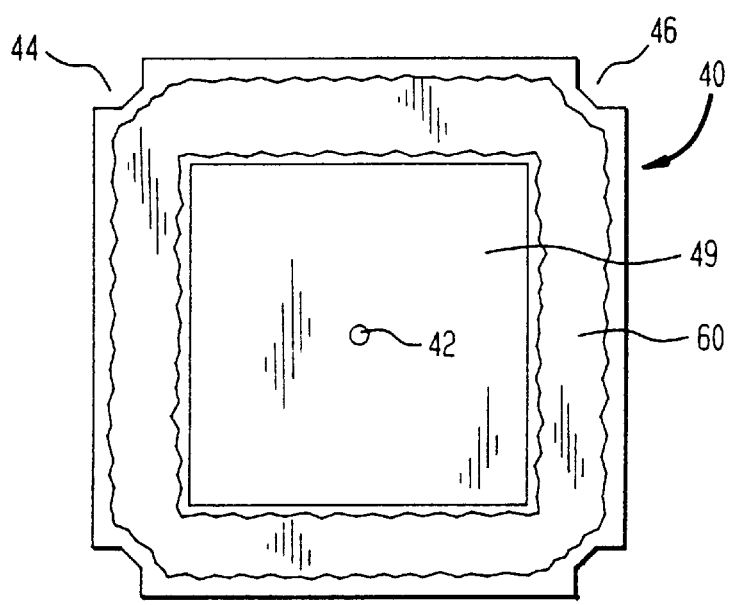
FIG. 5 illustrates the bottom view BB of FIG. 3A.

Referring now to FIG. 5 which is the bottom view BB of FIG. 3A, the bottom side of the cover wafer 40 is coated with a very thin layer of a low melting point solder glass frit 60. The solder glass frit 60 will serve to bond the cover member 40 to the transducer 10 as will be explained later with reference to FIGS. 6A and 6B.

Preferably, the glass frit 60 is pyroceram, a glass material manufactured by the Corning Glass Co. of Corning, N.Y. These glasses are thermosetting and devitrify at temperatures on the order of 450° C. Upon devitrification, the glass develops a crystalline structure which results in a strong seal as the crystallized material's softening point is higher than conventional glass. Pyroceram also exhibits excellent mechanical properties at temperatures well in excess of 600° F. ambient. In any event, it is understood that other solder glasses may alternatively be used, depending upon the application.

Heating the solder glass to a temperature above the softening point causes the glass to flow, and as the heating is continued, crystals nucleate and grow. The rate of the crystal growth is temperature dependent—the higher the temperature, the faster the crystal growth. Upon reheating (even to temperatures above the initial curing cycle), the bond remains stable.

Figure 6A:
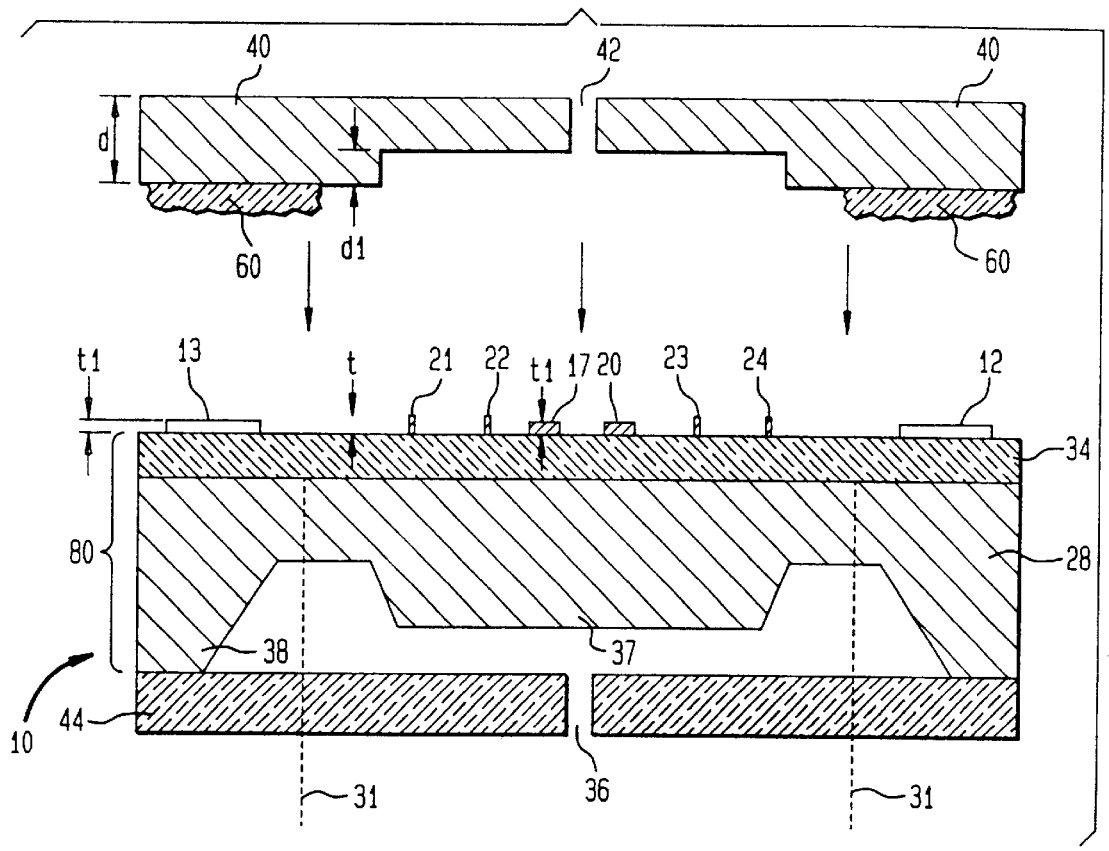
FIG. 6A depicts a cross-sectional view of the cover member of FIGS. 3–4 positioned to be bonded to the transducer structure of FIGS. 1–2.

The formation of a good, high temperature bond between the silicon cover member 40 and the transducer 10 is dependent upon the control of several basic steps. The finely powdered solder glass is mixed with a proper suspension vehicle, such as a mixture of nitrocellane in anylacerate, to a desired consistency to form a paste-like mixture or frit 60 (FIG. 4). The frit 60 is then placed on the bottom peripheral surfaces of the cover wafer 40 at a thickness of about 0.1 to 0.5 mils (0.0001 to 0.0005 in). This can be accomplished either manually or automatically using suitable tooling. The cover member 40 is then placed in position over the transducer 10, as depicted in FIG. 6A. The subsequent bonding of the cover member 40 will then be to the peripheral portion or non-active area of the transducer 10—i.e., the region outside the dotted lines 31.

Figure 6B:
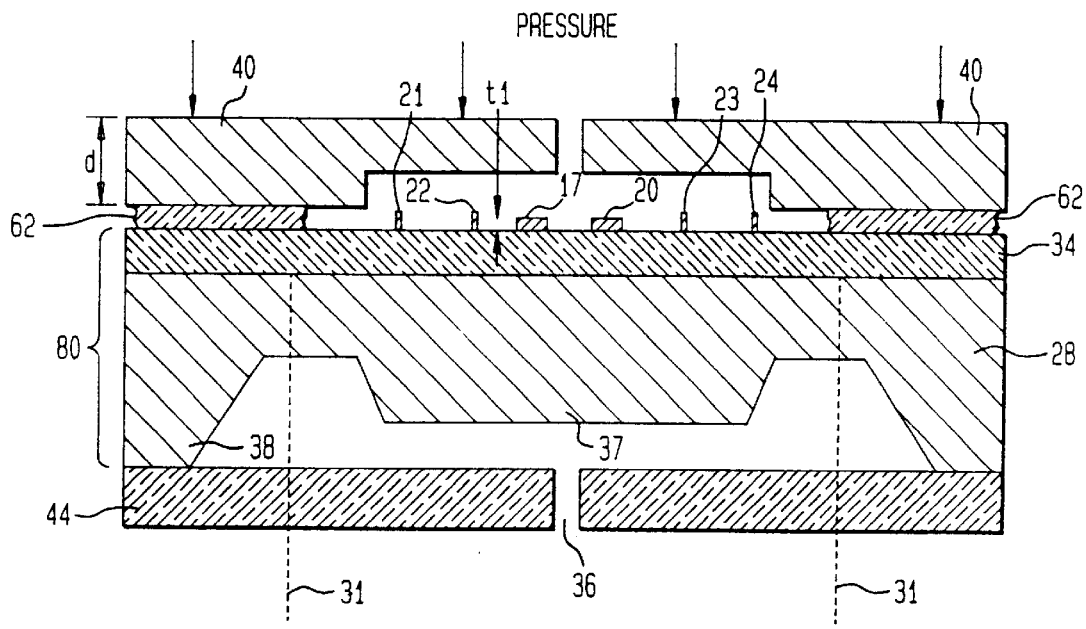
FIG. 6B shows the cover member of FIG. 3 being bonded to the transducer structure of FIGS. 1–2.

Next, the structure of FIG. 6B is placed in a heated chamber (not shown), and a uniform, moderate pressure is applied to the cover 40 using a clamping tool or the like without covering the aperture 42. This pressure will ensure that the paste-like frit 60 will be spread uniformly between the peripheral portions of the transducer 10 and cover 40. The structure of FIG. 6B is then heated for about 45 minutes at 420–450° C., which cures the glass frit 60, thereby bonding the cover 40 to the transducer 10. (Upon curing, the glass frit 60 becomes the peripheral glass layer 62). During this curing process, gases that are created between the cover 40 and transducer 10 escape through the aperture 42. The aperture 42 thus prevents the glass frit 60 from bubbling and outgassing during the curing process, which would otherwise create air gaps and prevent a hermetic seal along the periphery of the structure. Accordingly, the aperture 42 must be located within the region defined by the inner perimeter of the peripheral glass layer 62, albeit not necessarily in the center of that region as depicted in the figures.

Figure 7:
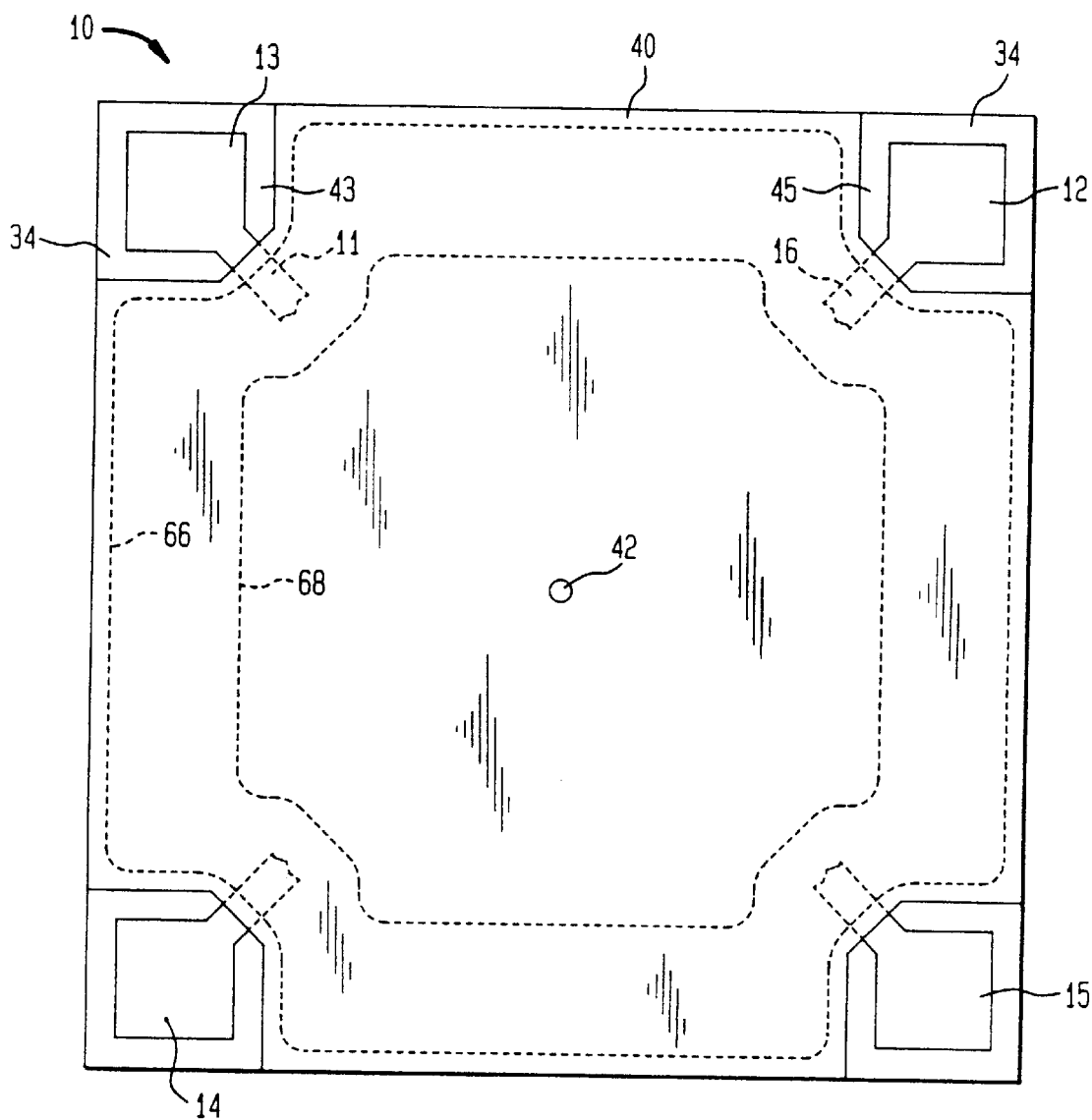
FIG. 7 is a plan view of FIG. 6B.

When the cover member 40 is bonded to the transducer 10, the glass layer 62 will directly bond the cover member 40 to the peripheral surfaces of the silicon dioxide layer 34 as well as to the portions of the silicon interconnections as 11 and 13 in proximity to the contacts 12–15. This is illustrated in FIG. 7 which is a plan view of the integrated structure of FIG. 6B. It is seen that the cover cut-outs 43–46 are designed large enough to expose the electrical contacts 12–15 when the cover 40 is bonded. In FIG. 7, the region occupied by the glass layer 62 is generally the peripheral area between the dotted lines 66 and 68. This area overlays peripheral surfaces of the interconnections 11 and 13 and of the silicon dioxide layer 34. It is noted that the interconnections as 17 have a thickness t1 (see FIG. 6B) on the order of 0.1 mil.

For the non-isolated transducer type which does not employ the dielectric layer 34, the glass layer 62 will directly bond to the peripheral portions of the top silicon surface of the transducer wafer 80 instead of to the dielectric layer 34. Alternatively stated, the layer 34 in the non-isolated case consists of silicon, to which the glass layer 62 is directly bonded.

Figure 8:
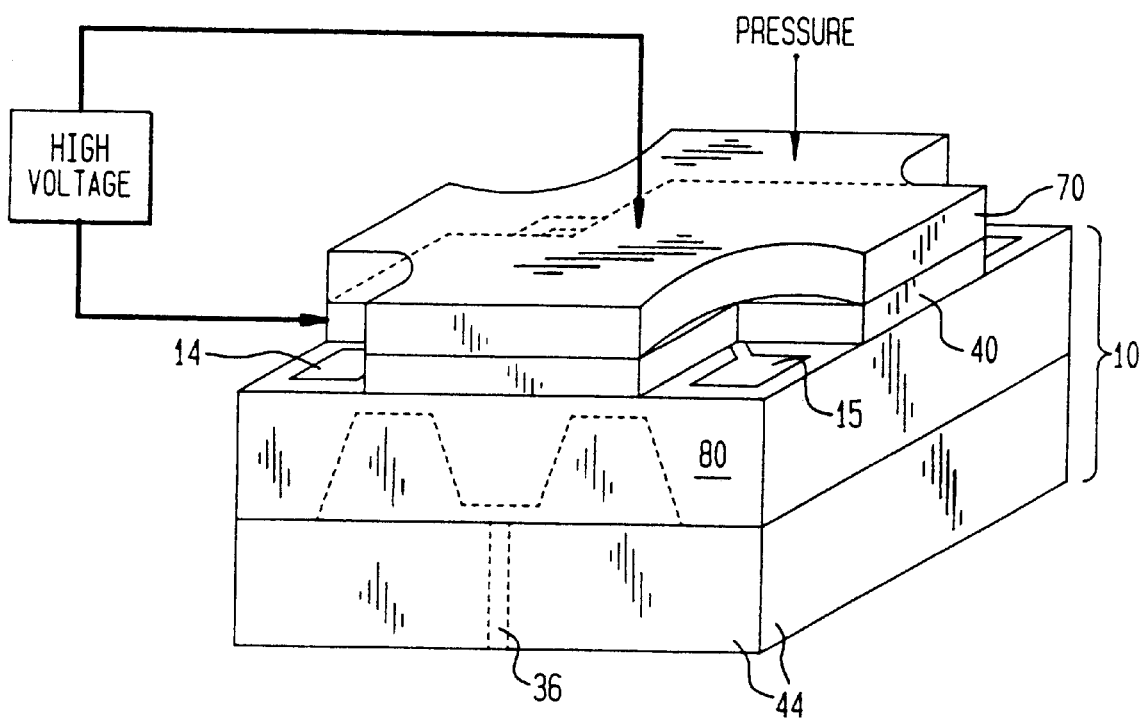
FIG. 8 shows a sealing member being electrostatically bonded to the cover member.

Following the successful bonding of the cover member 40 to the transducer 10, the next step is to hermetically seal the cover member aperture 42, which will result in the piezoresistors 21–24 being hermetically sealed from the external environment. Referring to FIG. 8, this is accomplished by electrostatically bonding a sealing member 70 to the top of the cover 40. In the illustrative embodiment, the cover member 40 is silicon and the sealing member 70 is a glass sheet, preferably pyrex. Alternatively, the cover member 40 could be composed of glass in which case the sealing member 70 would preferably be composed of silicon. The sealing member 70 is shown to be generally of the same thickness and congruent to the cover wafer 40. In any case, the glass sheet 70 should have corner cut-outs at least as large as the cut-outs 43–46 of the cover wafer 40 so as not to interfere with subsequent wire bonding to the contacts 12–15.

The electrostatic bonding of the sealing member 70 to the cover member 40 is performed in a vacuum thereby resulting in a hermetic seal upon its completion. Techniques for forming an electrostatic or anodic bond between glass and silicon are known. For example, see U.S. Pat. No. 4,040,172 entitled "Method of Manufacturing Integral Transducer Assemblies Applying Built-In Pressure Limiting", issued on Aug. 9, 1977 to A. D. Kurtz et al. and assigned to the assignee herein. Basically, a high voltage on the order of 400 to 1500 volts D.C. is applied between the sealing member 70 and the cover member 40 while slight pressure is applied to the top surface of the sealing member 70. The ambient temperature is then raised to 300–500° C. for a predetermined time duration. At this temperature, the glass member (i.e., whichever of the members 40 or 70 is made of glass) becomes slightly conductive and an intimate bond between the glass and silicon is formed which is on the order of 20 to 200 angstroms thick.

Upon completion of the electrostatic bonding operation, the transducer 10 is hermetically sealed and the resulting structure of FIG. 8 is removed from the vacuum chamber. External lead wires can then be wire bonded to the contacts 12–15 using conventional techniques, to provide the bias and return to and from the Wheatstone bridge formed by the piezoresistors.

Thus disclosed is a reduced size, hermetically sealed compact semiconductor transducer and method for producing the same. The transducer according to the present invention affords the advantage of eliminating the peripheral flanges and large contact posts of otherwise similar prior art transducers. The prior art peripheral flanges were disposed beyond the contact posts, which significantly enlarged the overall device. With these now eliminated, the present invention allows a smaller class of hermetically sealed transducers to be readily manufactured for a wide variety of applications.

It will be understood that the embodiments described herein are merely exemplary and that one skilled in the art can make many modifications and variation without departing from the spirit and scope of the invention. All such modifications are intended to be included within the scope of the invention as defined by the appended claims.

What is claimed is:

1. A hermetically sealed semiconductor transducer, comprising:

a transducer wafer having at least one semiconductor element disposed on a top surface thereof;

at least one electrical contact, coupled to said semiconductor element, disposed on said top surface of said transducer wafer and extending from said semiconductor element to an outer portion of said top surface;

a cover member dimensioned to surround said semiconductor element;

a peripheral glass frit bond between said transducer wafer and said cover member and between at least a portion of said electrical contact and said cover member;

said cover member having an aperture in a top portion thereof, said aperture positioned above a region bounded by said peripheral glass frit bond, said aperture employed to prevent air gap formation in said peripheral glass frit bond;

a sealing member for hermetically sealing said aperture;

whereby a vacuum is maintained between said semiconductor element and said cover member, said semiconductor element thereby being hermetically sealed from the external environment, while at least a portion of said electrical contact remains exposed to enable external wire attachment thereto.

2. The transducer according to claim 1, wherein said cover member comprises a silicon wafer.

3. The transducer according to claim 1, wherein said peripheral glass frit bond comprises pyroceram.

4. The transducer according to claim 1, wherein said electrical contact comprises a contact terminal of a given thickness on said outer portion of said dielectric layer, said contact terminal adapted to connect to an external wire, and at least one electrical interconnection of a thickness generally equal to said given thickness, said electrical interconnection disposed along said top surface of said dielectric layer and electrically connecting said at least one transducer element with said electrical contact terminal and wherein said peripheral glass bond is between at least a portion of said interconnection and said cover member.

5. The transducer according to claim 4 wherein said transducer element, said electrical contact and said interconnection are comprised of highly doped silicon.

6. The transducer according to claim 4, wherein said diaphragm having a central region which deflects in response to an external force applied to said diaphragm, said central region defining an active area of said transducer, said semiconductor elements being located within said active area and changing resistance in response to said external force.

7. The transducer according to claim 6 wherein said peripheral glass frit bond is formed only in a non-active area of said transducer, said non-active area being an area of said transducer other than said active area.

8. The transducer according to claim 1 wherein:

said transducer wafer comprises a silicon diaphragm; and said at least one semiconductor element and said at least one electrical contact are disposed on said silicon diaphragm.

9. The transducer according to claim 8, wherein said cover member comprises glass and wherein said sealing member comprises silicon.

10. A hermetically sealed semiconductor transducer, comprising:

a diaphragm having a dielectric layer disposed thereon, with at least one semiconductor element disposed on a top surface of said dielectric layer;

at least one electrical contact, coupled to said semiconductor element, disposed on said top surface of said dielectric layer and extending from said semiconductor element to an outer portion of said top surface;

a cover member dimensioned to surround said semiconductor element;

a peripheral glass frit bond between said dielectric layer and said cover member, and between at least a portion of said electrical contact and said cover member;

said cover member having an aperture in a top portion thereof, said aperture positioned above a region bounded by said peripheral glass frit bond, said aperture employed to prevent air gap formation in said peripheral glass frit bond;

a sealing member for hermetically sealing said aperture;

whereby a vacuum is maintained between said semiconductor element and said cover member, said semiconductor element thereby being hermetically sealed from the external environment, while at least a portion of said electrical contact remains exposed to enable external wire attachment thereto.

11. The transducer according to claim 10 wherein said at least one electrical contact comprises at least a pair of electrical contacts disposed on opposite sides of said top dielectric surface, and wherein said cover member being generally congruent to said dielectric layer and having cut-outs corresponding to at least said pair of electrical contacts whereby said pair of electrical contacts remains exposed when said cover member is bonded to said transducer.

12. The transducer according to claim 10 wherein said sealing member comprises a glass sheet electrostatically bonded to said cover member.

13. The transducer according to claim 12 wherein said dielectric layer is of a generally square geometry, with said cover member and said glass sheet being generally congruent to said dielectric layer, with cutouts in each of said cover member and said glass sheet generally corresponding to said at least one pair of electrical contacts to enable external connection thereto.

* * * * *